United States Patent [19]

Nakao

[11] Patent Number: 5,763,849
[45] Date of Patent: Jun. 9, 1998

[54] WIRE BONDING APPARATUS

[75] Inventor: Mitsuhiro Nakao, Yokohama, Japan

[73] Assignee: Kabushiki Kaisha Toshiba, Kawasaki, Japan

[21] Appl. No.: 771,909

[22] Filed: Dec. 23, 1996

[30] Foreign Application Priority Data

Dec. 27, 1995 [JP] Japan .................. 7-341800

[51] Int. Cl.⁶ .................................. B23K 11/16

[52] U.S. Cl. .................. 219/56.21; 219/130.21

[58] Field of Search ............ 219/56.21, 56.22, 219/130.21, 130.5, 130.31, 130.32, 130.33

[56] References Cited

U.S. PATENT DOCUMENTS 5,212,361   5/1993   Miyazaki et al. .............. 219/130.33
5,463,197  10/1995   Miyazaki et al. .............. 219/56.21

Primary Examiner—Clifford C. Shaw
Attorney, Agent, or Firm—Finnegan, Henderson, Farabow, Garrett & Dunner, L.L.P.

[57] ABSTRACT

In a wire bonding apparatus comprising a torch electrode for melting an end of a metallic thin wire to form a ball thereof, a high voltage detecting circuit for detecting a voltage between the metallic thin wire and the torch electrode in order to output the detected voltage as a voltage signal, a ball diameter calculator, and a ball diameter display device for displaying the ball diameter outputted from the ball diameter calculator, are further provided.

4 Claims, 11 Drawing Sheets

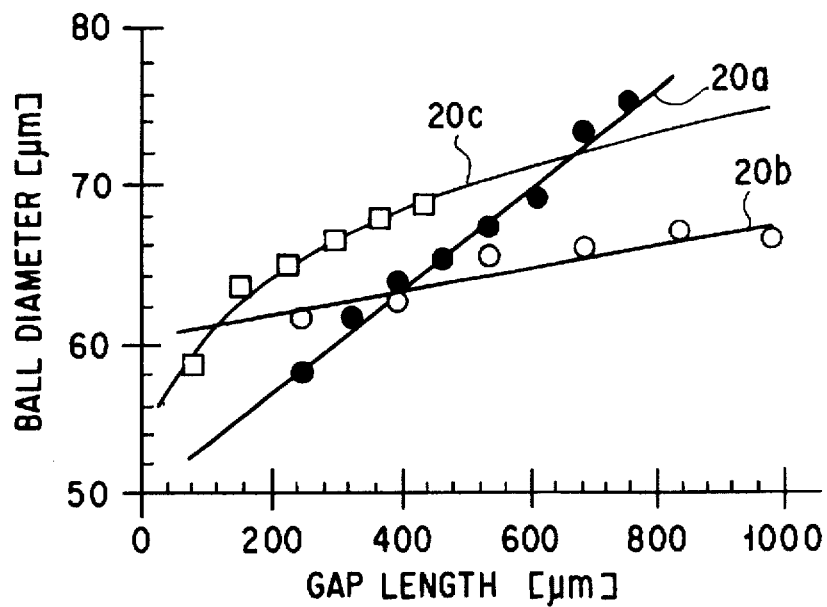
F I G. 3A
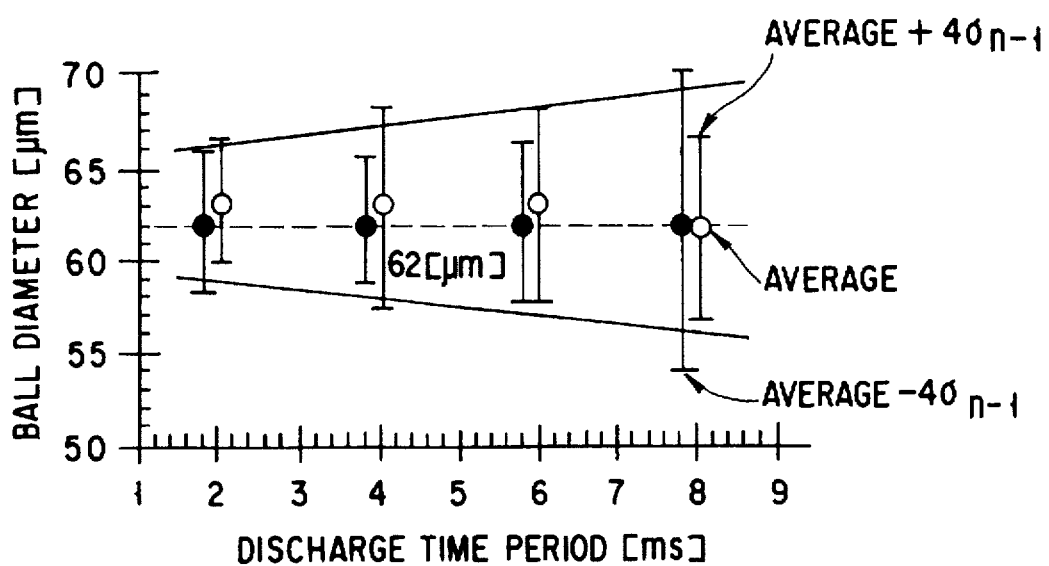
F I G. 3B

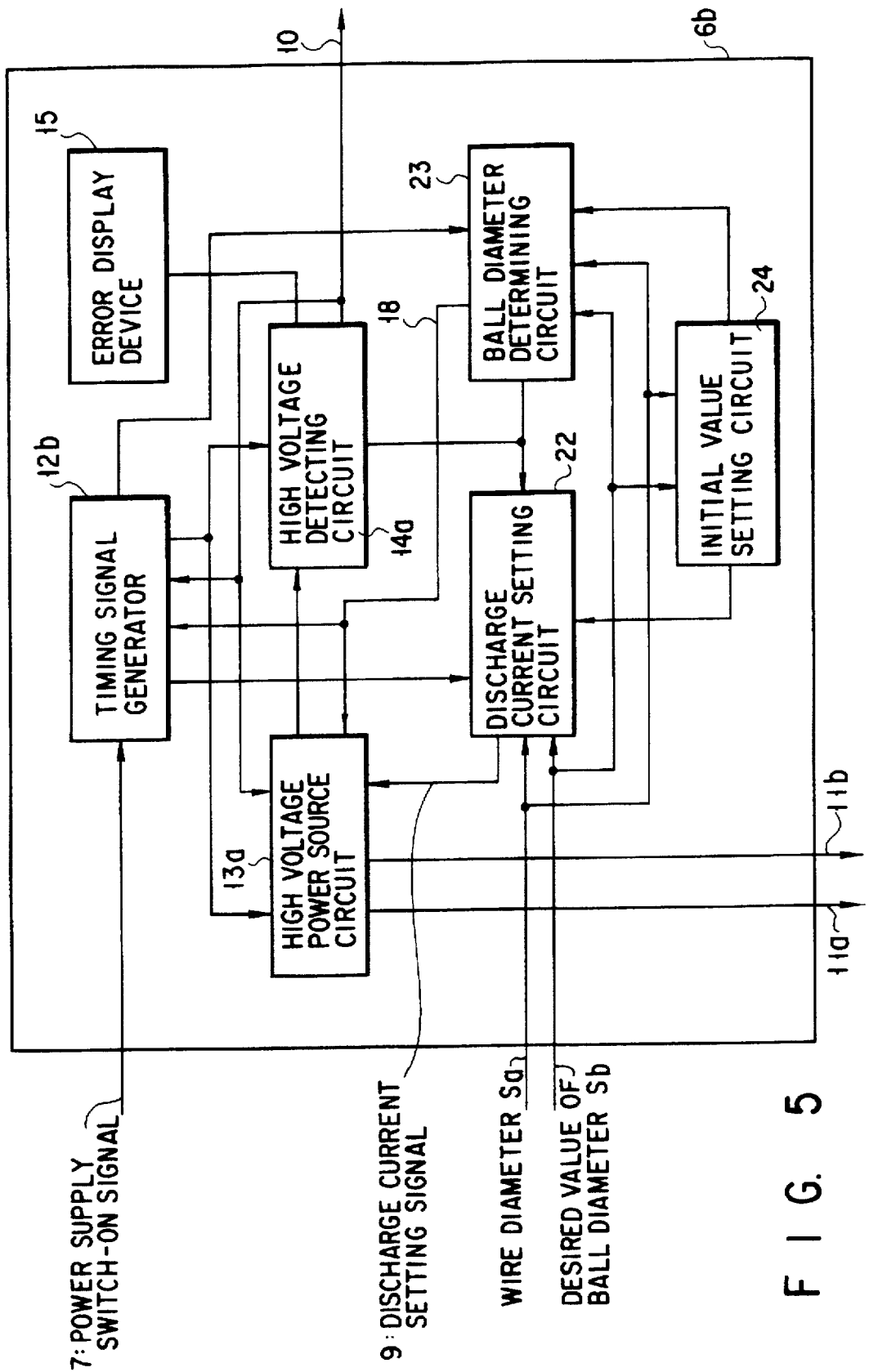
F I G. 5

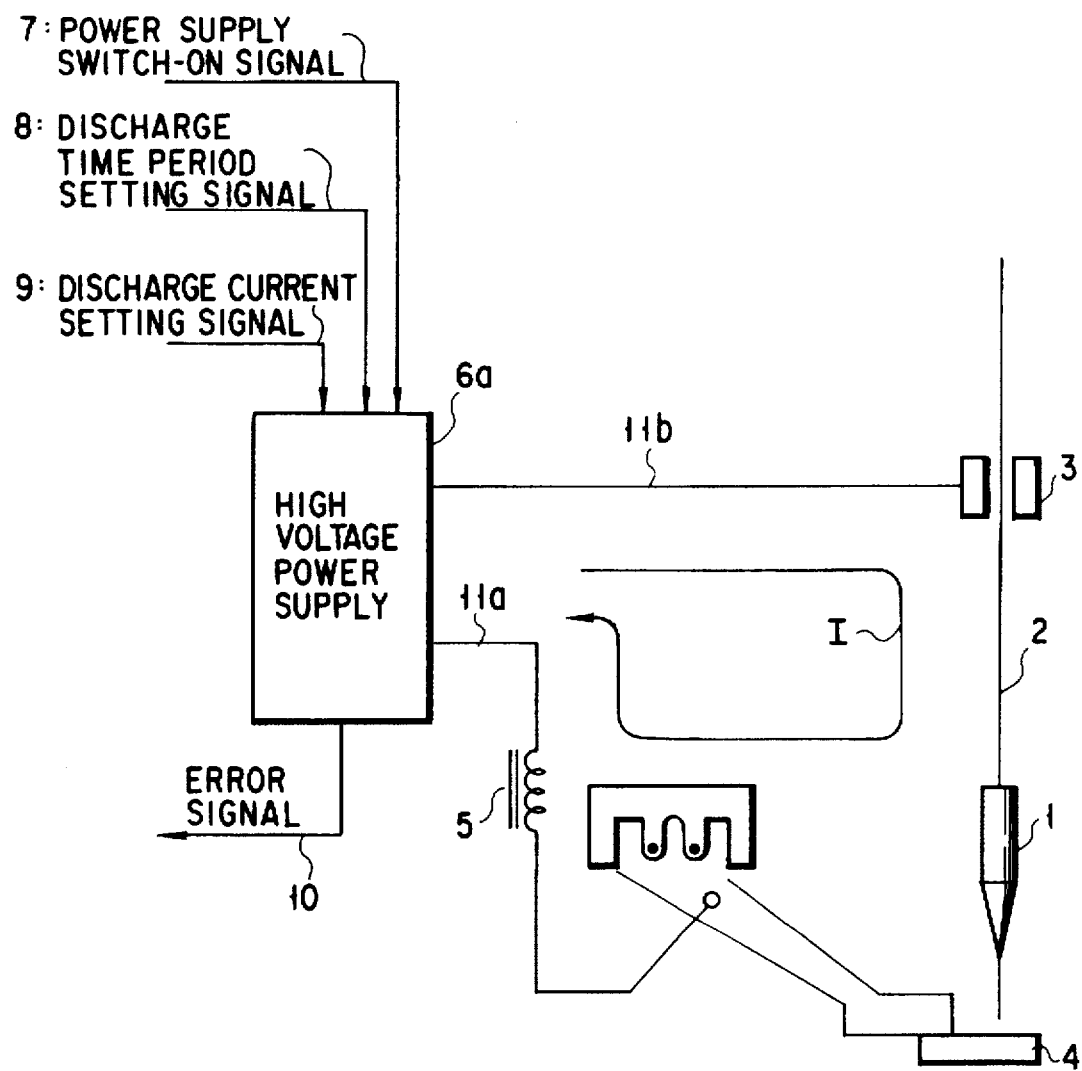
F I G. 13

WIRE BONDING APPARATUS

BACKGROUND OF THE INVENTION

The present invention relates to a wire bonding apparatus. More especially, the invention relates to an improvement of an apparatus corresponding to a small ball narrow pad pitch product of a nail head bonding type.

In a ball formation method using a conventional wire bonding apparatus of a nail head bonding type, a high voltage is applied to a gap between a metallic thin wire and a torch electrode for a predetermined time period. That is, a predetermined current is flowed for a predetermined time period so that the end of the metallic thin wire is melted for a ball formation. The ball is used so that the metallic thin wire is connected to a pad for bonding.

FIG. 9 is a schematic diagram showing a construction of a conventional wire bonding apparatus of a nail head bonding type.

A metallic thin wire 2 is passed through a capillary 1. The metallic thin wire 2 is grasped by a damper 3. A torch electrode 4 is disposed near the end of the metallic thin wire 2. The torch electrode 4 is connected to one output terminal 11a of a discharge current of a high voltage power supply 6 via a coil 5 for stabilizing a discharge. Also, the clamper 3 is connected to the other output terminal 11b of the high voltage power supply 6. That is, a loop comprises one output terminal 11a of the high voltage power supply 6, the torch electrode 4, the metallic thin wire 2, the damper 3 and the output terminal 11b of the high voltage power supply 6 so that an electric circuit is formed. A power supply switch-on signal 7, a signal for setting a discharge time period (referred below to as a discharge time period setting signal) 8 and a signal for setting a discharge current (referred below to as a discharge current setting signal) 9 are inputted from a computer (not shown) for system control (not shown) to the high voltage power supply 6. Also, the high voltage power supply 6 supplies the computer with an error signal 10 described below.

FIG. 10 is a block diagram showing a basic construction of the high voltage power supply 6. The high voltage power supply 6 is explained below referring to FIG. 10. The power supply switch-on signal 7 and the discharge time period setting signal 8 are inputted to a timing signal generator 12. The timing signal generator 12 generates a discharge start timing signal according to the power supply switch-on signal 7. When time set by the discharge time period setting signal 8 passes, the discharge start timing signal is stopped. The discharge start timing signal outputted from the timing signal generator 12 is inputted to a high voltage power source circuit 13 and a high voltage detecting circuit 14. The discharge current setting signal 9 is inputted to the high voltage power source circuit 13. The discharge current is outputted from the output terminals 11a and 11b of the high voltage power source circuit 13. A voltage between the output terminals 11a and 11b is inputted to the high voltage detecting circuit 14. When the voltage between the output terminals 11a and 11b is out of a predetermined value, the error signal 10 is generated by the high voltage detecting circuit 14. The error signal 10 is supplied to the timing signal generator 12, the high voltage power source circuit 13, an error display device 15 and the computer for system control.

FIG. 11 is a flow chart showing a control operation of the bonding apparatus prior to a boding operation by the bonding apparatus. The control operation by the bonding apparatus is explained below.

First, as shown in FIG. 11, a wire is replaced (Step S1), secondly, a ball is formed at the end of the replaced wire (Step S2). The formed ball diameter is measured (Step S3). When the ball diameter is a predetermined value, the control operation is completed. On the other hand, when the ball diameter is not a predetermined value, the end of the wire is cut in order to remove the formed ball. Next, the discharge current/the discharge time period are changed in order to re-form the ball (Step S4). The reformation is repeated many times until the ball diameter reaches a predetermined value. After the ball diameter reaches a predetermined value, the bonding operation is carried out by the bonding apparatus so that a semiconductor apparatus is manufactured.

FIG. 12 is a flow chart showing an operation procedure of the bonding apparatus at the ball formation step shown in FIG. 11.

The power supply switch-on signal 7 is inputted to the bonding apparatus in order to synchronize to a peripheral equipment. Further, the above preset discharge time period setting signal 8 and discharge current setting signal 9 are inputted to the bonding apparatus (Step S11). Then, the discharge start timing signal is generated so that the high voltage power source circuit 13 (shown in FIG. 10) generates the discharge current according to the discharge current setting signal 9. The discharge current is outputted from the output terminals 11a and 11b. The high voltage detecting circuit 14 detects a voltage value Vo between the output terminals immediately before a voltage Vup, an open-error signal is outputted to the error display device 15. An open-error is displayed by the error display device 15 (Steps S12, S13 and S14). The above voltage value Vup is set to a voltage value corresponding to the case that the metallic thin wire 2 is not appropriately set to the capillary 1. On the other hand, when the voltage value Vo between the output terminals is less than a voltage Vdn, a short-error signal is outputted to the error display device 15. A short-error is displayed by the error display device 15 (Steps S12, S15 and S16). The above voltage value Vdn is set to a voltage value corresponding to the case that the distance between the metallic thin wire 2 and the torch electrode 4 is shorter. When the above open-error or short-error is occurred, a system computer stops the bonding operation according to the error signal 10.

When the above open-error and short-error are not occurred, the timing signal generator 12 measures the discharge time period (Step S17). When time set by the discharge time period setting signal 8 passes, the discharge start timing signal is stopped. The discharge is completed in order to complete the ball formation. The above high voltage power source circuit 13 is a constant-current power source for outputting a specified discharge current during a specified discharge time period.

However, according to the above conventional construction, there is the following disadvantage.

Conventionally, as shown in FIG. 11, an operator sets values of the discharge current setting signal 9 and the discharge time period setting signal 8 so that the ball diameter is satisfied with a predetermined value. Thus, time is necessary so that the bonding apparatus is controlled by the operator. That is, there is a problem that it takes a long time to control the ball diameter at the end of the metallic thin wire 2.

For example, the wire diameter φ30 μm and the ball diameter φ75 μm are changed to φ25 μm and φ70 μm, respectively. In this case, it takes 10 to 20 minutes to change the values described above.

Also, although the distance between the capillary 1 and the torch electrode 4 is constant, the metallic thin wire 2 is stretched in order to be cut. Accordingly, there is caused a variation of a length of the metallic thin wire 2 projected from the end of the capillary 1 for each bonding operation. That is, a distance between the end of the metallic thin wire 2 and the torch electrode 4, that is, a gap length is varied. The variation of the gap length varies the ball diameter also. When the metallic thin wire 2 is bonded to a pad for bonding on a semiconductor chip, a variation of a bonded portion diameter is caused due to instability of the ball diameter. Thereby, there are occurred the following disadvantages. That is, a bonded layer thickness is thin. Further, the bonded portion diameter is too large that the bonded portion is contacted with an adjacent pad. Accordingly, in order to use a semiconductor product having a narrow pad pitch, it is necessary to severely control the ball diameter and the bonded portion diameter where the ball is bonded to the pad.

BRIEF SUMMARY OF THE INVENTION

In view of the above conditions, it is an object of the present invention to provide a more reliable wire bonding apparatus for taking a short time to set and control a requirement so that a bonding operation can be carried out.

In order to solve the problem and to achieve the object, a wire bonding apparatus of the present invention is constructed as follows.

According to one aspect of the invention, a wire bonding apparatus comprises a torch electrode, and a capillary disposed near the torch electrode for introducing a metallic thin wire for bonding nearby the torch electrode. The wire bonding apparatus further comprises a timing signal generator for generating a discharge start timing signal according to a start signal. The wire bonding apparatus further comprises a high voltage power source circuit having an input terminal inputted with a stop signal and a discharge current setting signal, wherein the discharge start timing signal is supplied so that a current is supplied for the metallic thin wire and the torch electrode according to the discharge current setting signal in order to generate a discharge between the metallic thin wire and the torch electrode, whereby the end of the metallic thin wire is melted so that a ball is formed, the stop signal is inputted so that the current supply is stopped. The wire bonding apparatus further comprises a high voltage detecting circuit for detecting a voltage between the metallic thin wire and the torch electrode in order to output the detected voltage as a voltage signal, and a ball diameter calculator having an input terminal inputted with a signal showing a predetermined value of a ball diameter and a signal showing a wire diameter of the metallic thin wire, wherein the voltage signal is inputted so that the formed ball diameter is calculated by a value of the voltage signal, the signal showing the predetermined value of the ball diameter and the signal showing the wire diameter. Also, the wire bonding apparatus further comprises a ball diameter display device for displaying the formed ball diameter outputted from the ball diameter calculator.

According to the wire bonding apparatus of the above present invention, the ball diameter is calculated in order to be displayed. Accordingly, an operator does not need to set the discharge current and the discharge time period, and to repeat a measurement of the ball diameter in order to control the bonding apparatus. Accordingly, since the trouble due to the control is reduced, the operator does not suffer from the trouble when operating the apparatus. Further, even when the distance between the end of the metallic thin wire and the torch electrode, that is, a gap length is varied, it is possible to form the ball having a constant ball diameter. Accordingly, the ball diameter is less varied. Thereby, when the metallic thin wire is bonded to a pad, a variation of the bonded portion diameter becomes less. That is, it is possible to prevent from a short-circuiting by contacting an adjacent pad due to a thinner bonded portion thickness and an excessive bonded portion diameter. Accordingly, it is possible to enhance a reliability of the bonded portion.

According to another aspect of the invention, a wire bonding apparatus, wherein the timing signal generator supplies the discharge start timing signal for the ball diameter calculator. When the discharge start timing signal is supplied, the ball diameter calculator detects a minimum value and a maximum value of the voltage signal. Further, the formed ball diameter is calculated by the minimum and maximum values of the voltage signal, the other values of the voltage signal, a signal showing the predetermined value of the ball diameter and a signal showing the wire diameter.

According to the wire bonding apparatus of the above present invention, even when the gap length is varied, the ball diameter is calculated in a high precision. Accordingly, it is possible to make the ball diameter constant. That is, a variation of the ball diameter is less. When the metallic thin wire is bonded to the pad, a variation of the bonded portion diameter becomes less. Accordingly, it is possible to prevent from a short-circuiting by contacting an adjacent pad due to a thinner bonded portion thickness and an excessive bonded portion diameter. Accordingly, it is possible to enhance a reliability of the bonded portion.

According to further aspect of the invention, a wire bonding apparatus comprises a torch electrode, and a capillary disposed near the torch electrode for introducing a metallic thin wire for bonding nearby the torch electrode. The wire bonding apparatus further comprises a timing signal generator for generating a discharge start timing signal according to a start signal. The wire bonding apparatus further comprises a high voltage power source circuit having an input terminal inputted a stop signal and a discharge current setting signal, wherein the discharge start timing signal is supplied so that a current is supplied for the metallic thin wire and the torch electrode according to the discharge current setting signal in order to generate a discharge between the metallic thin wire and the torch electrode, whereby the end of the metallic thin wire is melted for a ball formation, the stop signal is inputted so that the current supply is stopped. The wire bonding apparatus further comprises a high voltage detecting circuit for detecting a voltage between the metallic thin wire and the torch electrode in order to output the detected voltage as a voltage signal. The wire bonding apparatus further comprises a discharge current setting circuit having an input terminal inputted with a signal showing the predetermined value of the ball diameter and a signal showing the wire diameter of the metallic thin wire, wherein the discharge start timing signal is inputted so that a value of the discharge current is calculated by the inputted signal showing the ball diameter of the inputted predetermined value and signal showing the wire diameter in order to output the discharge current setting signal. The wire bonding apparatus further comprises a ball diameter determination circuit, wherein the signal showing the predetermined value of the ball diameter, the signal showing the wire diameter and the voltage signal are inputted so that the formed ball diameter is not only calculated by the signal showing the predetermined value of the ball diameter, the signal showing the wire diameter and the voltage signal, but also is compared to the predetermined value of the ball diameter, whereby, when the formed ball diameter is determined to correspond to the predetermined value of the ball diameter, the stop signal is supplied for the high voltage power source circuit.

According to the wire bonding apparatus of the above present invention, since the ball diameter is obtained in a high precision by the voltage signal, the ball diameter can be controlled with a high accuracy. Also, the signal showing the wire diameter and the signal showing the predetermined value of the ball diameter can only be inputted. Therefore, it is possible to reduce a controlling time and to operate the apparatus easily. Accordingly, when the metallic thin wire is bonded to the pad, a variation of the bonded portion diameter can become less so that it is possible to enhance a reliability of the bonded portion.

According to further aspect of the invention, a wire bonding apparatus comprises an initial value setting circuit, wherein the signal showing the predetermined value of the ball diameter and the signal showing the wire diameter are inputted so that an initial value of a setting requirement is provided for the discharge current setting circuit and the ball diameter determination circuit. Also, the discharge current setting circuit calculates a value of the discharge current by the signal showing the predetermined value of the ball diameter, the signal showing the wire diameter and the initial value. Also, the timing signal generator supplies the discharge start timing signal for the ball diameter determination circuit. The ball diameter determination circuit supplied with the discharge start timing signal detects a minimum value and a maximum value of the voltage signal. Also, the ball diameter determination circuit calculates the ball diameter by the minimum and maximum values of the voltage signal, the other values of the voltage signal, the signal showing the predetermined value of the ball diameter and the initial value and the signal showing the wire diameter.

According to the wire bonding apparatus of the above present invention, since the ball diameter can be obtained in high precision by the voltage signal, it is possible to control the ball diameter in high precision. Accordingly, it is possible to reduce a controlling time. Thereby, when the metallic thin wire is bonded to the pad, a variation of the bonded portion diameter becomes less. Further, under any condition, it is possible to make a variation of the ball diameter smaller. That is, it is possible to enhance a reliability of the bonded portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3A is a graph showing a relationship between the gap length and the ball diameter;

FIG. 3B is a graph showing a relationship between the discharge time period and the ball diameter;

FIG. 5 is a block diagram showing a part of the wire bonding apparatus according to a second embodiment of the present invention;

FIG. 13 is a schematic diagram of a construction of the wire bonding apparatus of the present invention.

DETAILED DESCRIPTION OF THE INVENTION

Figure 1:
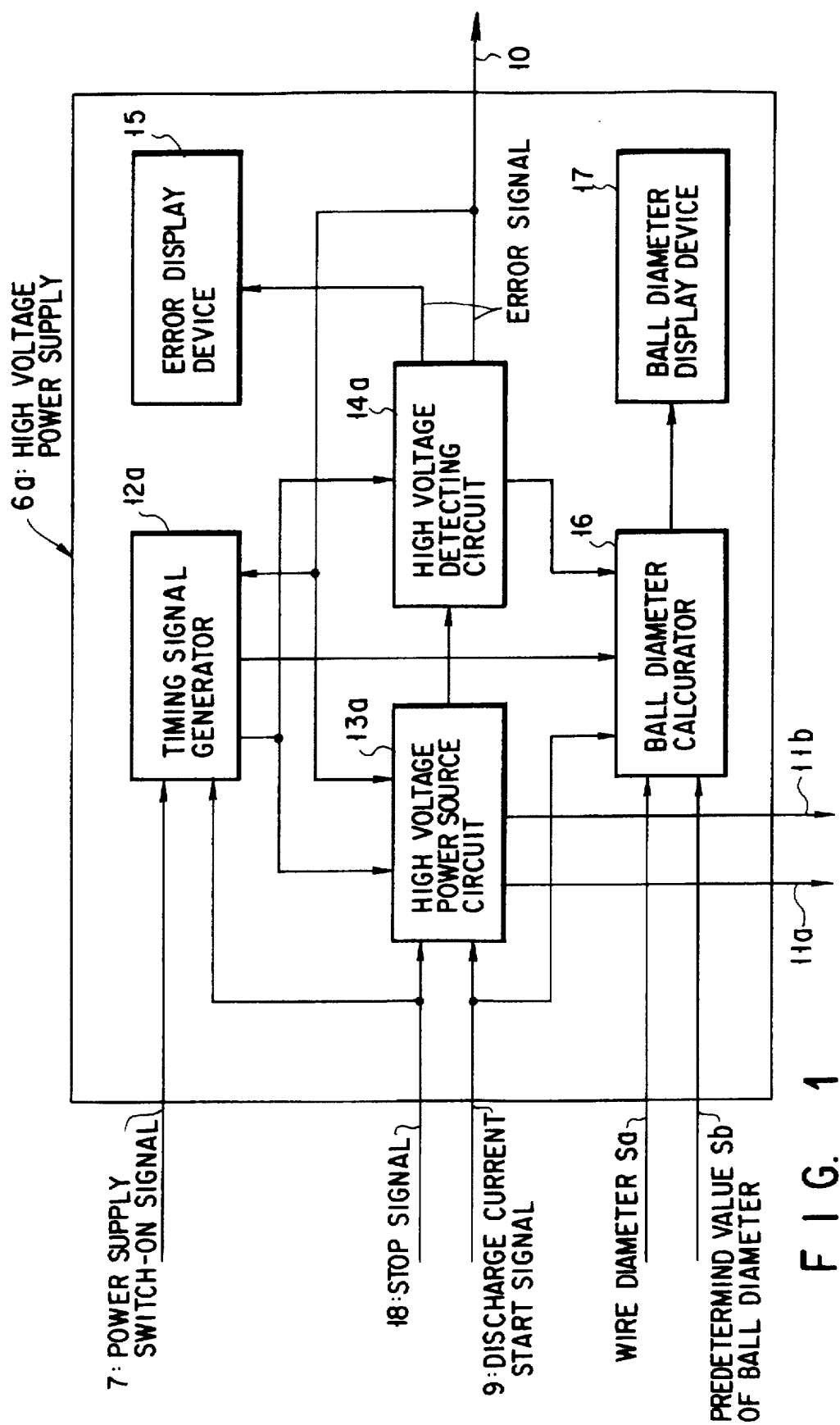
FIG. 1 is a block diagram showing a part of a wire bonding apparatus according to a first embodiment of the present invention.
Figure 9:
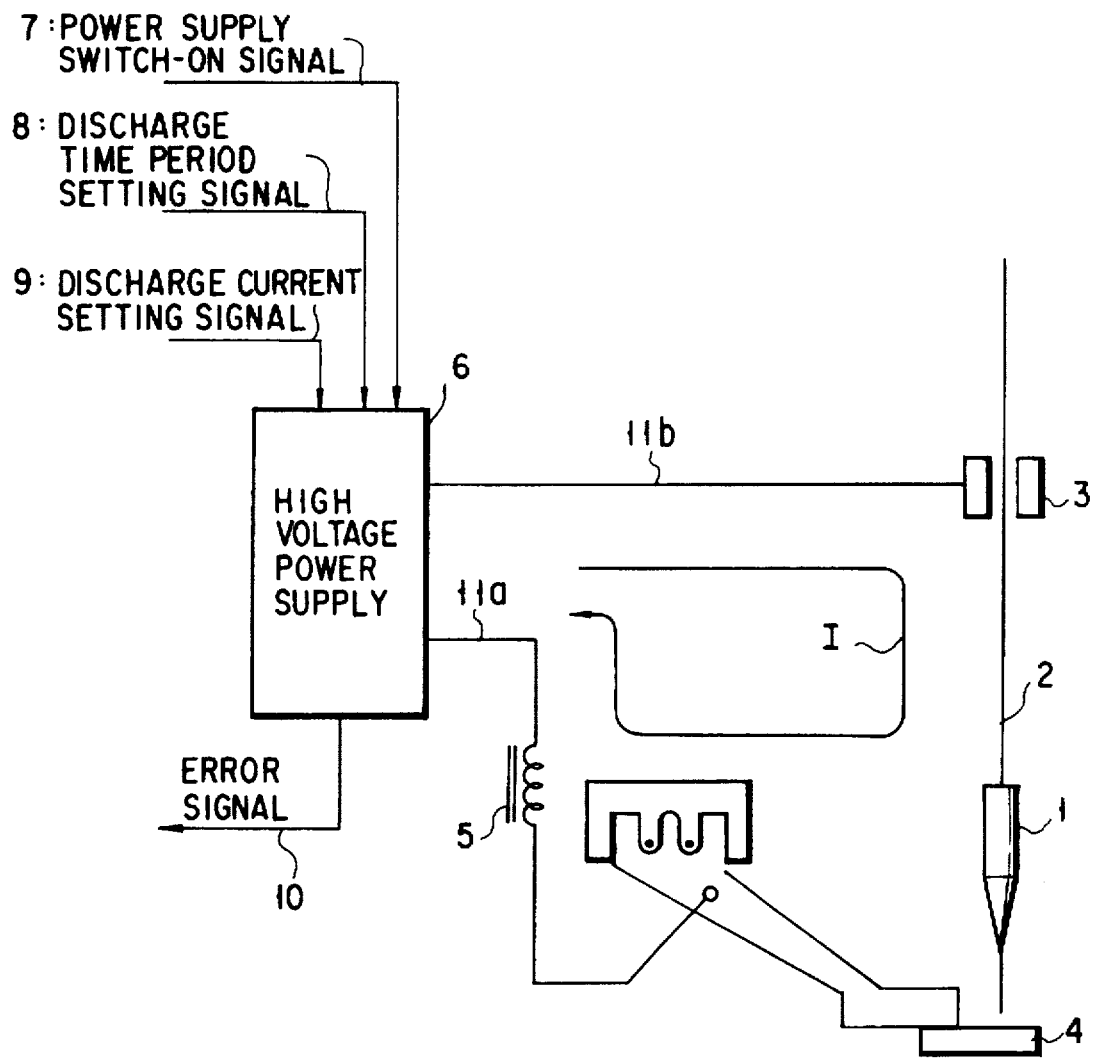
FIG. 9 is a schematic diagram of a construction of a conventional wire bonding apparatus.
Figure 10:
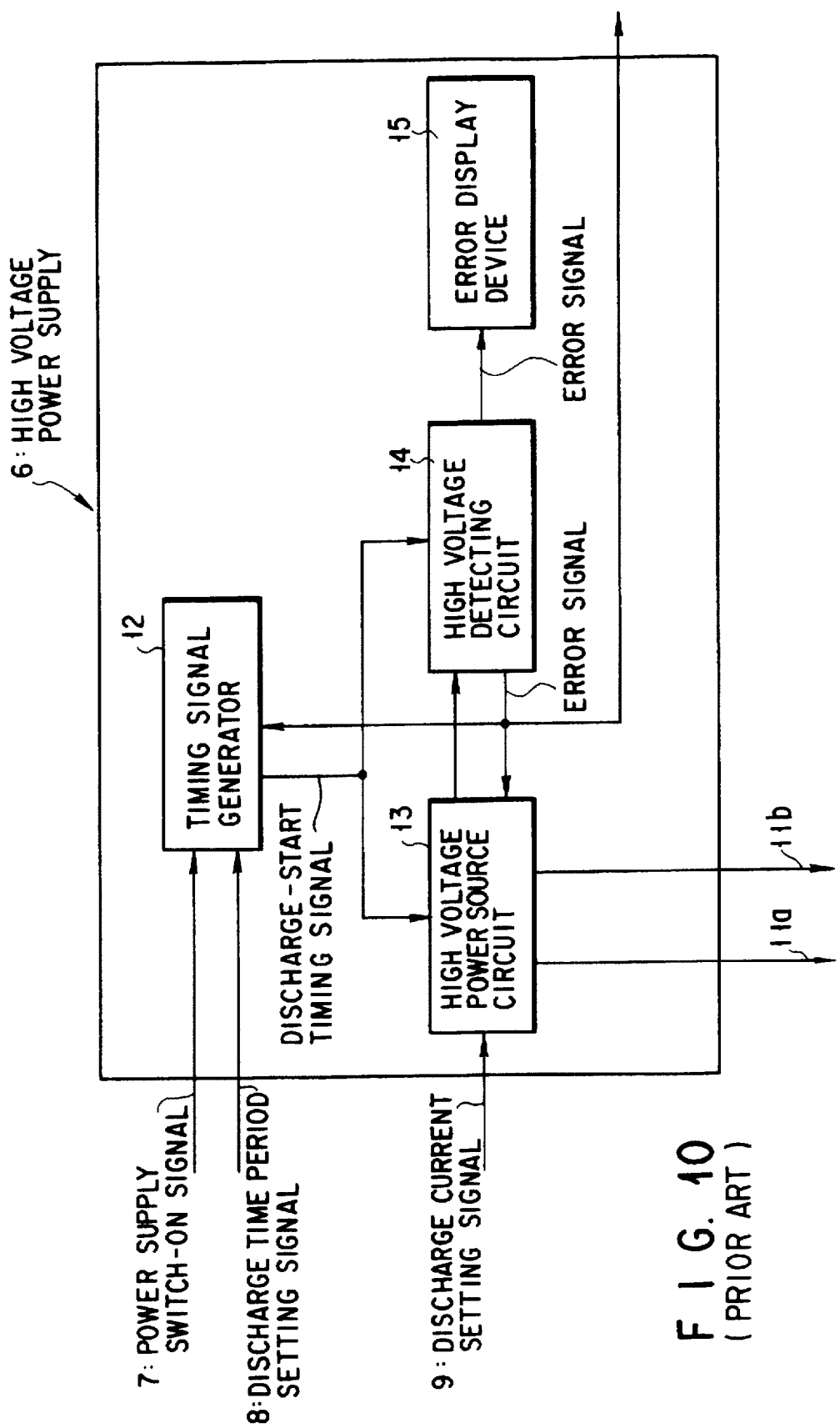
FIG. 10 is a block diagram showing a part of the conventional wire bonding apparatus.
Figure 11:
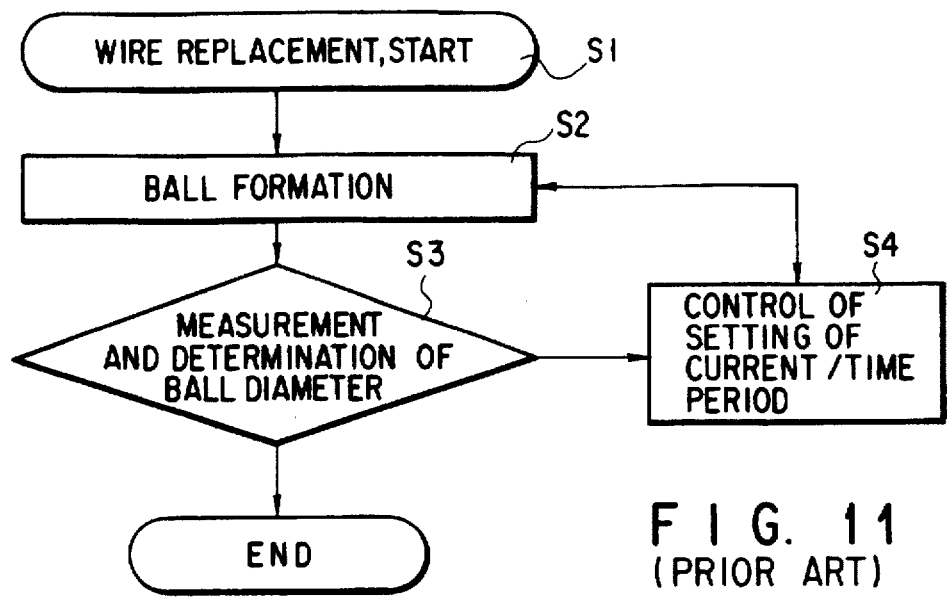
FIG. 11 is a flow chart illustrating the conventional wire bonding apparatus.
Figure 12:
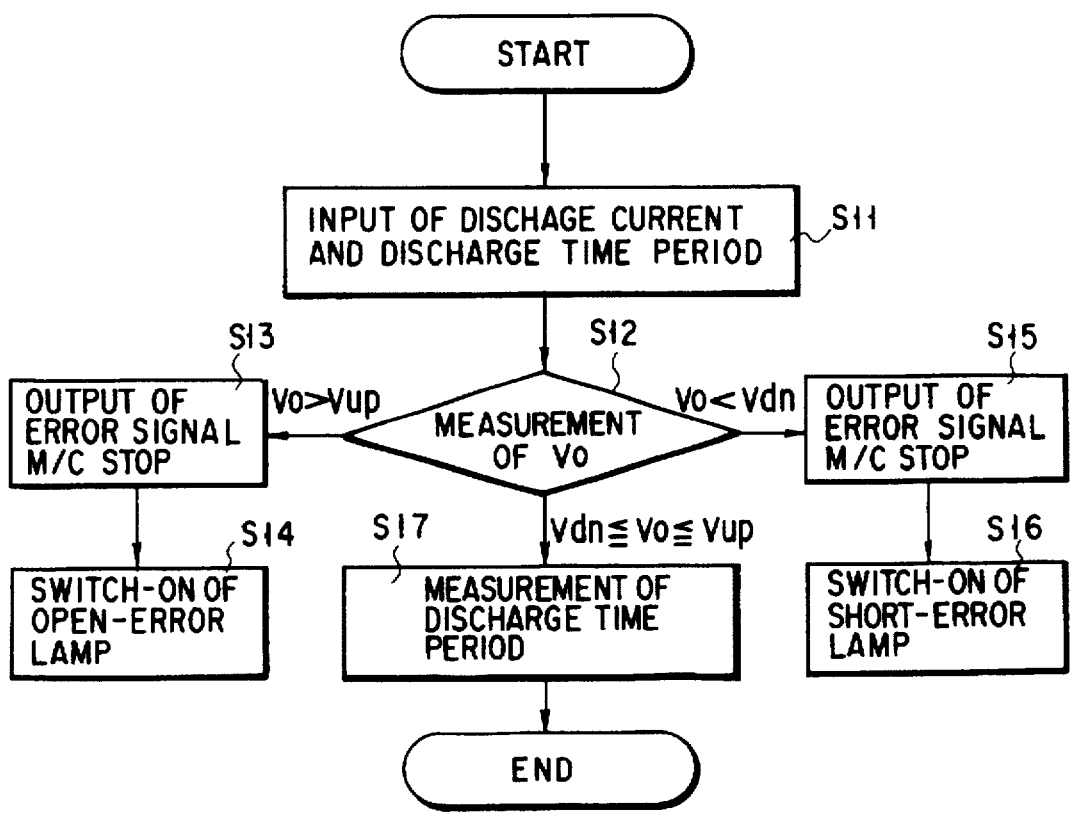
FIG. 12 is a flow chart illustrating the conventional wire bonding apparatus.

Embodiments of the present invention are explained below referring to the drawings. FIG. 13 is a schematic diagram showing a construction of the wire bonding apparatus of the present invention. The construction of FIG. 13 is schematically same as that of FIG. 9 showing prior art. As shown in FIG. 1, the different portions of the construction are the detail of a high voltage power supply in order to explain the portions mainly. The elements having the same reference numbers in FIG. 1 are the same portions in FIG. 10 showing prior art.

Figure 2A:
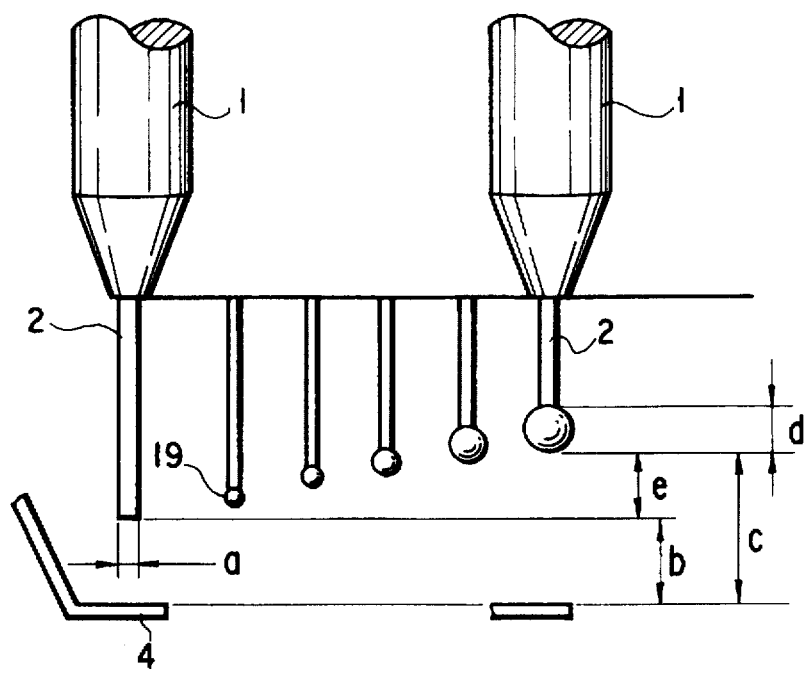
FIG. 2A is an outside view of a part of a construction of the wire bonding apparatus in FIG. 13.
Figure 2B:
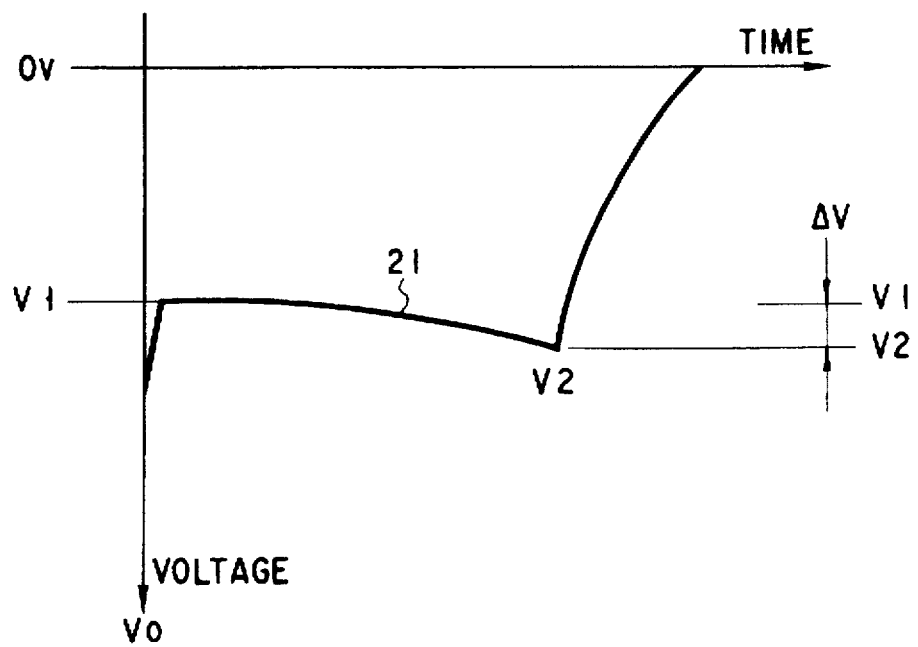
FIG. 2B is a graph showing a change of the voltage between the output terminals 11a and 11b in FIGS. 1 and 13.

FIG. 1 is a block diagram showing a construction of a high voltage power supply 6a according to a first embodiment of the present invention. FIG. 2A and FIG. 2B illustrate an operation of the first embodiment. More specifically, FIG. 2A is an outside view of one part of a construction in FIG. 13. FIG. 2B is a graph showing a change of the voltage between the output terminals 11a and 11b in FIGS. 1 and 13. The main difference between the construction of the high voltage power supply 6a of the first embodiment and the high voltage power supply 6 in FIG. 9 is that a ball diameter calculator 16 and a ball diameter display device 17 are added to the construction of the first embodiment. The difference is mainly explained below.

In FIG. 1, a signal Sa showing the wire diameter of the metallic thin wire, a signal Sd showing the predetermined value of the ball diameter, a discharge current setting signal 9, a voltage signal between output terminals corresponding to the voltage value between output terminals 11a and 11b outputted from a high voltage detecting circuit 14a, and a discharge start timing signal from a timing signal generator 12a are inputted to the ball diameter calculator 16. The ball diameter calculator 16 calculates the ball diameter according to the inputted signals. The output signal from the ball diameter calculator 16 is supplied for the ball diameter display device 17. Also, a stop signal 18 inputted from an input terminal is inputted to the timing signal generator 12a and the high voltage power source circuit 13a. Here, the voltage value between the output terminals 11a and 11b can be considered as a discharge voltage between the ball and the torch electrode 4. According to the first embodiment, it is not necessary to input the discharge time period setting signal 8 (FIG. 10).

Next, an operation of the high voltage power supply 6a according to the first embodiment is explained below.

First, the signal Sd showing the predetermined value of the ball diameter, the signal Sa showing the wire diameter, the discharge current setting signal 9 and the power supply switch-on signal 7 are inputted. In this case, the discharge switch-on timing signal is supplied for the high voltage power source circuit 13a and the high voltage detecting circuit 14a from the timing signal generator 12a.

In FIG. 2B, the ordinate shows a voltage value between the output terminals, and the abscissa shows a time. As shown in FIG. 2B, according to the discharge start timing signal, a high voltage is applied between the metallic thin wire 2 and the torch electrode 4. When the voltage value reaches a negative voltage value Vo between the output terminals, an arc discharge is occurred. In this point of time, a minimum value, that is, the voltage value Vo between the output terminals immediately before a discharge start is increased up to the voltage value V1 between the output terminals immediately after discharge as shown by a solid line 21. Where, the absolute value of the voltage value Vo becomes maximum, and the absolute value of the voltage value V1 is less than that of the voltage value Vo. The voltage signal between the output terminals corresponding to the voltage values Vo, V1 between the output terminals is supplied for the ball diameter calculator 16 via the high voltage detecting circuit 14a. Thereby, the voltage signal is stored into the ball diameter calculator 16.

As shown in FIG. 2A, when a discharge is started, the distance between the metallic thin wire 2 and the torch electrode 4 is defined as a distance b. The metallic thin wire 2 is melted by the arc discharge in order to be spheroidized from the end of the metallic thin wire 2. Thus, a gap length between the torch electrode 4 and ball 19 becomes larger. That is, the metallic thin wire 2 is melted so that the metallic thin wire 2 is changed to a ball. As an area of the ball is larger, the gap length is longer. In this case, the voltage value between the output terminals of the high voltage power source circuit 13a is gradually reduced as shown by the solid line 21. The ball diameter calculator 16 calculates a voltage difference ΔV by a signal corresponding to the voltage value between the output terminals and a signal corresponding to the stored voltage value V1. One difference ΔV corresponds to one value of the ball diameter. That is, a change of the voltage value ΔV and a value of the ball diameter calculated by ΔV are displayed by the ball diameter display device 17. When the ball diameter reaches the predetermined value, the stop signal 18 is inputted so that the discharge is completed. That is, the change of the voltage value ΔV is used in order to calculate and display the ball diameter.

The ball diameter is calculated from a gap length corresponding to ΔV at a point of time as described below. A gap length b immediately before a discharge start is obtained from the voltage value Vo between the output terminals immediately before a discharge start. Also, when the metallic thin wire 2 is melted so that the metallic thin wire 2 becomes longer, a gap length c is obtained from the voltage value V1 between the output terminals and the voltage difference ΔV. Further, a difference between the gaps c and b, that is, a reduction e of the gap length is calculated.

The above reduction e is used so that a ball diameter x at a point of time is determined by the following equation.

$$e = ((4/3) \times \pi (x/2)3)/(\pi (a/2)2) - x$$

Next, a relationship between the gap length, the discharge time period, the discharge current and the discharge voltage is explained below. FIG. 3A is a graph showing a relationship between the gap length, that is, the distance between the torch voltage and the ball, and the ball diameter under the same condition of the other requirement. FIG. 3B is a graph showing a relationship between the discharge time period and the ball diameter. In this case, the discharge current similarly to the conventional apparatus is set relative to respective discharge time period.

As shown by the solid lines 20a, 20b in FIG. 3A, in case that the other conditions are same, sometimes the ball diameter is proportional to the gap length b when the discharge is started. As shown by a solid line 20c, even when the ball diameter is not proportional to the gap length, a monovalent function is shown. In case of the solid line 20a, ±4 π is 132 μm. In case of the solid line 20c, ±4 π is 60 μm.

As shown in FIG. 3B, the ball diameter is scarcely changed relative to the discharge time period. As the discharge time period is longer, more variation of the ball diameter is occurred. Thus, it is better that the discharge time period is not long. Also, a variation of the ball diameter depends on the above gap length.

Figure 4A:
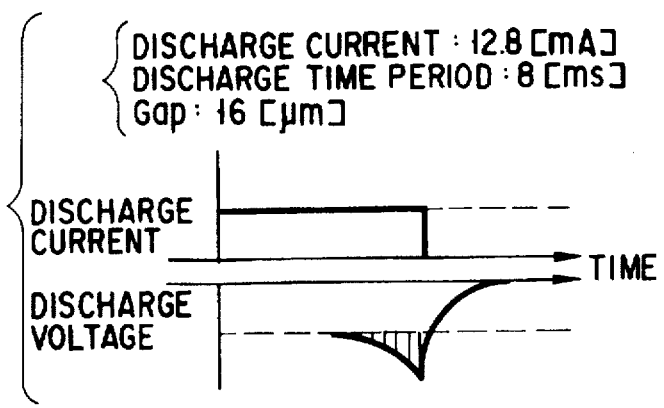
FIG. 4A is a graph showing a time period and a discharge current, and a change of the discharge voltage.
Figure 4B:
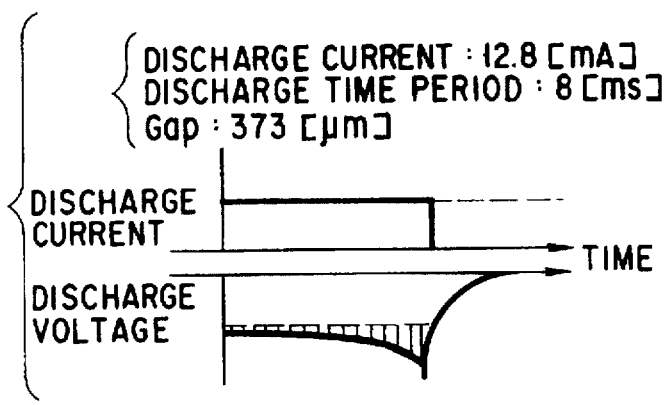
FIG. 4B is a graph showing a time period and a discharge current, and a change of the discharge voltage.
Figure 4C:
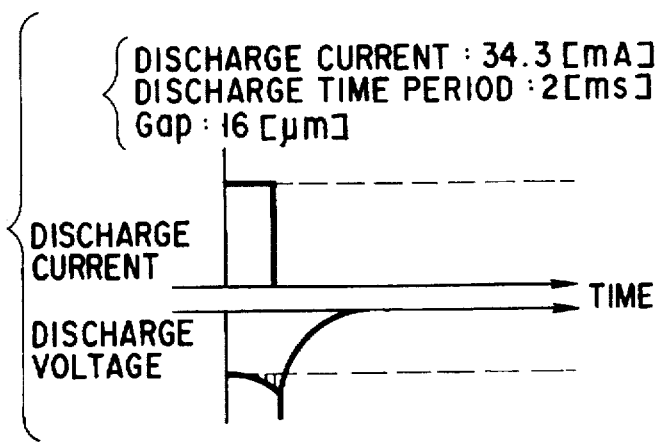
FIG. 4C is a graph showing a time period and a discharge current, and a change of the discharge voltage.
Figure 4D:
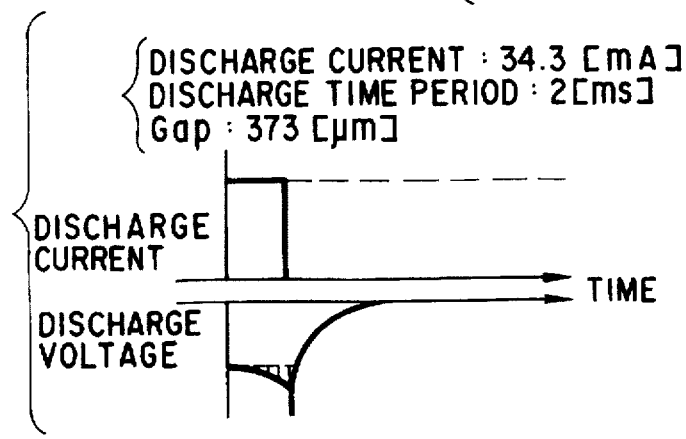
FIG. 4D is a graph showing a time period and a discharge current, and a change of the discharge voltage.

FIGS. 4A to 4D are graphs each showing a time passage and a discharge current, and a change of the discharge voltage, that is, a voltage between the ball and the torch electrode. In FIG. 4A, when the discharge current, the discharge time period and the gap length are initially set to 12.8 mA, 8 ms and 16 μm, respectively, the change of the discharge current and the discharge voltage is shown. Similarly, in FIG. 4B, when the discharge current, the discharge time period and the gap length are initially set to 12.8 mA, 8 ms and 373 μm, respectively, a change of the discharge current and the discharge voltage is shown. In FIG. 4C, when the discharge current, the discharge time period and the gap length are initially set to 34.3 mA, 2 ms and 16 μm, respectively, a change of the discharge current and the discharge voltage is shown. In FIG. 4D, when the discharge current, the discharge time period and the gap length are initially set to 34.3 mA, 2 ms and 373 μm, respectively, a change of the discharge current and the discharge voltage is shown.

As shown in FIGS. 4A to 4D, since the high voltage power source circuit 13a is a constant-current power source, the discharge current is shaped as almost square wave. On the other hand, as the discharge time period passes, the voltage is reduced from the voltage between the output terminals immediately after the discharge start (its absolute value is increased). After the discharge is completed, the discharge voltage is increased according to a time constant of an electric circuit where the discharge current is flowed (its absolute value is reduced).

FIG. 4A is compared to FIG. 4B, or FIG. 4C is compared to FIG. 4C. When the discharge time period and the discharge current of FIG. 4A are same as those of FIG. 4B, as the gap length is larger, an integral value (shown by slant lines) of change of the discharge voltage from after the discharge start becomes larger. Also, FIGS. 4A and 4B are compared to FIGS. 4C and 4D. When the discharge time period is shorter, as the discharge current is smaller, the change of the above integral value is smaller relative to the gap length. In this case, the ball diameter tends to be larger according to the above integral value. A relationship between the discharge time period, the discharge current, the gap length and the ball is considered as a complicated relationship such as a structure of an apparatus and so on. However, the above relationship is a monovalent function. Since the relationship has reproducibility, the above relationship can only be once examined. Thereby, when either the discharge time period or the discharge voltage is set, the other value is calculated from the value of the discharge voltage when the discharge is started and the change of the discharge voltage after the discharge is started. Further, it is possible to calculate and determine the gap length and the ball diameter. In FIGS. 4A to 4D, the voltage value Vo between the output terminals immediately before the discharge start is not shown, since the voltage value Vo is changed for a relatively short time. In stead of the discharge current setting signal 9, the discharge time period setting signal 8 may be inputted.

According to the first embodiment, the ball diameter is calculated and displayed. Accordingly, the operator does not need to set the discharge current and the discharge time period and to repeat a measurement of the ball diameter in order to control the apparatus. Thereby, since the trouble is reduced, the operator can operate the apparatus easily. That is, a control time is reduced after a wire replacement. Further, even when the distance between the metallic thin wire 2 and the torch electrode 4, that is, the gap length is varied, it is possible to constantly control the ball diameter. Accordingly, a variation of the ball diameter becomes smaller. After the metallic thin wire is bonded to the pad, a variation of the bonded portion diameter becomes smaller so that it is possible to realize stability. That is, it is possible to prevent from a short-circuiting by contacting an adjacent pad due to a thinner bonded portion thickness and an excessive bonded portion diameter. Further, since the predetermined value of the ball diameter can be digitally set, it is possible to easily control the accurate value of the ball diameter.

Figure 6:
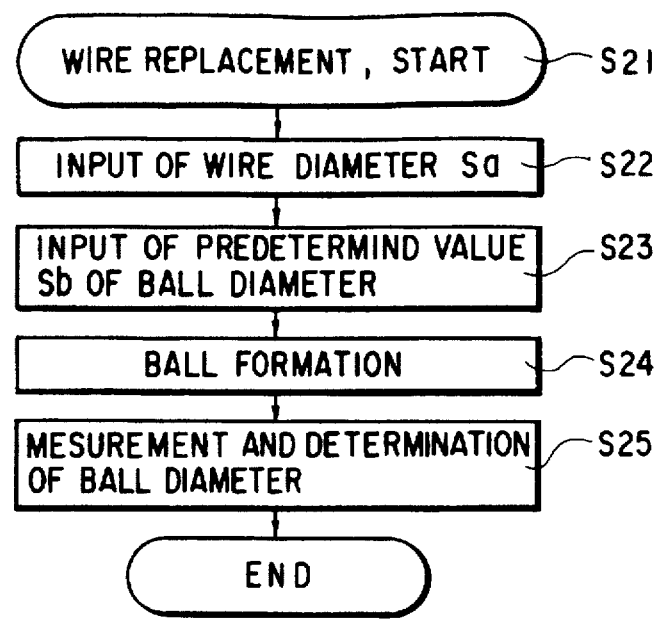
FIG. 6 is a flow chart illustrating the wire bonding apparatus according to the second embodiment of the present invention.
Figures 8A, 8B:
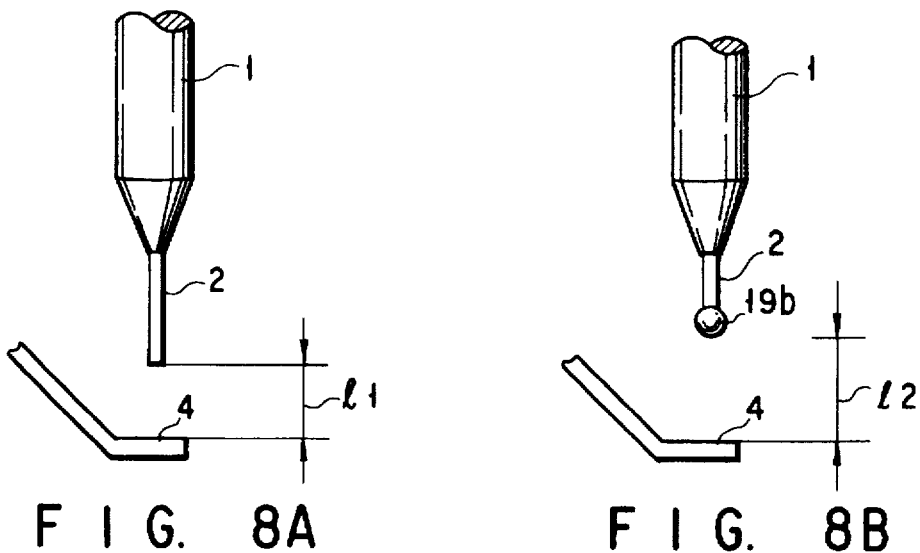
FIG. 8A shows an outside view of a part of the wire bonding apparatus according to the second embodiment of the present invention.
FIG. 8B shows an outside view of a part of the wire bonding apparatus according to the second embodiment of the present invention.
Figure 8C:
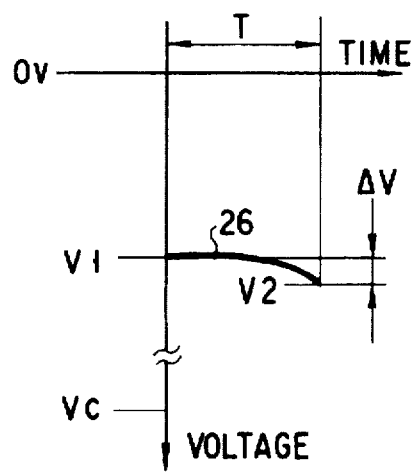
FIG. 8C is a graph showing a change of the voltage value between the output terminals.
Figure 7:
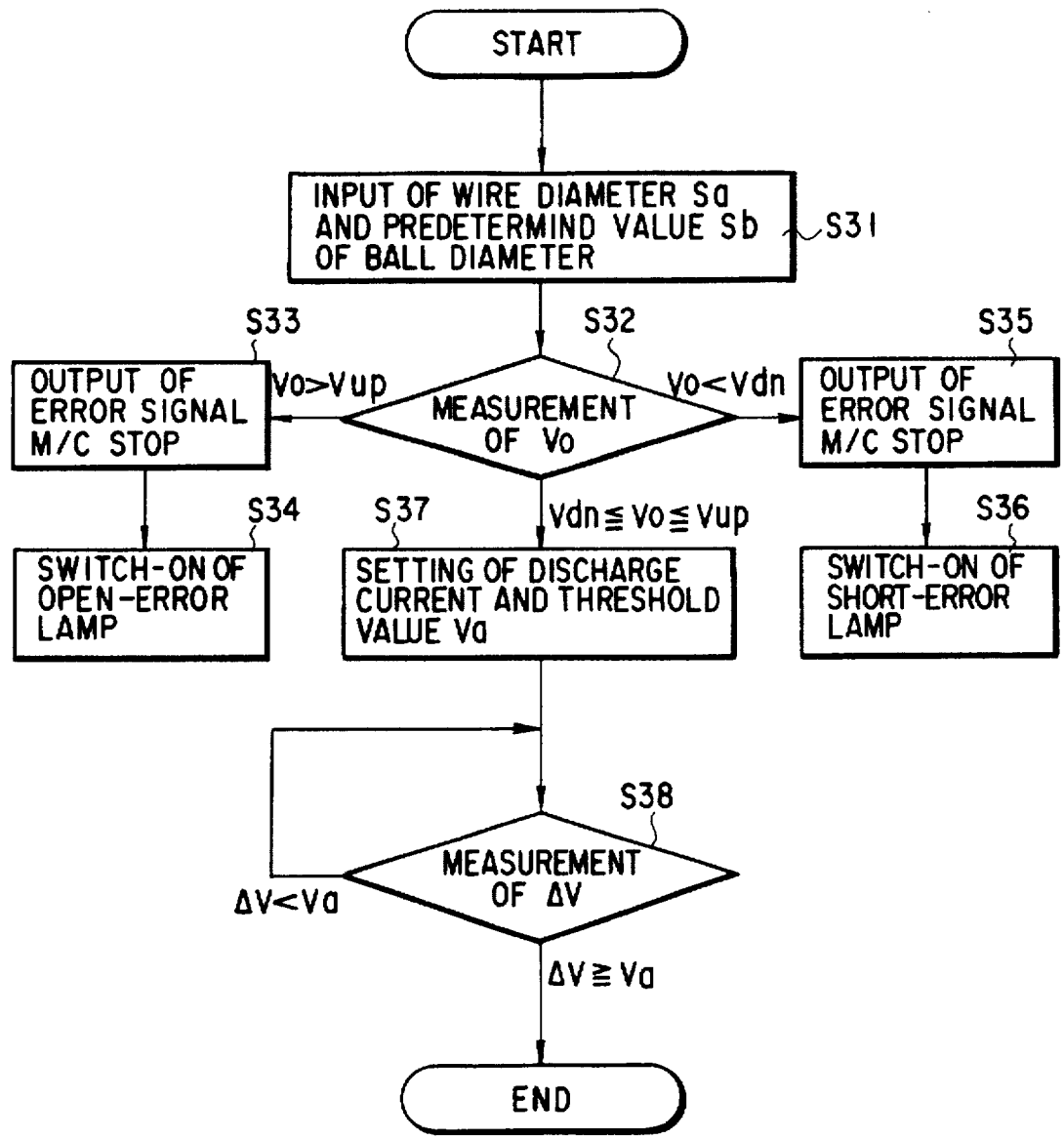
FIG. 7 is a flow chart illustrating the wire bonding apparatus according to the second embodiment of the present invention.

FIG. 5 is a block diagram showing a construction of a high voltage power supply 6b according to a second embodiment. FIG. 6 is a flow chart showing the control operation of the bonding apparatus, performed prior to the bonding operation by the bonding apparatus. FIG. 7 is a flow chart showing an operation procedure of the bonding apparatus at the ball formation step. FIG. 8 illustrates an operation. FIG. 8A and FIG. 8B show outside views of portions of the bonding apparatus. FIG. 8C is a graph showing a change of the voltage value between the output terminals. The high voltage power supply 6b of the second embodiment is different from the high voltage power supply 6a of the first embodiment as follows. That is, the construction of the second embodiment also comprises a discharge current setting circuit 22, a ball diameter determination circuit 23 and an initial value setting circuit 24. The difference is mainly explained below.

As shown in FIG. 5, a signal Sa showing the wire diameter, a signal Sd showing the predetermined value of the ball diameter, the voltage signal between the output terminals from the high voltage detecting circuit 14a, an initial value setting data from the initial value setting circuit 24 and a discharge start timing signal from the timing signal generator 12b are inputted to the discharge current setting circuit 22. The discharge current setting circuit 22 calculates the values of the discharge current according to the inputted signals. The discharge current setting signal 9 outputted from the discharge current setting circuit 22 is supplied for the high voltage power source circuit 13a. The signal Sa showing the wire diameter of the metallic thin wire 2, the signal Sd showing the predetermined value of the ball diameter, the voltage signal between the output terminals from the high voltage detecting circuit 14a, the initial value setting data from the initial value setting circuit 24 and the output signal from the timing signal generator 12b are inputted to the ball diameter determination circuit 23. The ball diameter determination circuit 23 calculates the ball diameter according to the inputted signals. Further, the ball diameter determination circuit 23 compares the calculated ball diameter to the signal Sd showing the predetermined value of the ball diameter in order to determine the accurate ball diameter. The stop signal 18 outputted from the ball diameter determination circuit 23 is supplied for the high voltage power source circuit 13a. The stop signal 18 stops discharge. The signal Sa showing the wire diameter and the signal Sd showing the predetermined value of the ball diameter are inputted to the initial value setting circuit 24. Similarly to the first embodiment, according to the second embodiment, it is not necessary to input the discharge time period setting signal 8.

Next, an operation of the second embodiment is explained below.

As shown in FIG. 6, after the wire replacement (Step S21), a requirement is set in order to form the ball at the end of the metallic thin wire 2 described below. First, the signal Sa showing the used wire diameter and the signal Sd showing the predetermined value of the ball diameter are inputted (Steps S22, S23). According to the bonding apparatus of the second embodiment, similarly to the method of the first embodiment, a requirement is automatically calculated and set in order to form the ball (Step S24). After then, the ball diameter is measured for confirmation so that the bonding apparatus is completed to be controlled (Step S25).

The main difference between the second and first embodiments is as follows. That is, the discharge current setting circuit 22 calculates the discharge current setting signal 9 or the discharge time period. Further, the ball diameter determination circuit 23 determines whether the ball diameter reaches the predetermined value or not according to the voltage difference ΔV. The difference is mainly explained below.

As shown in FIG. 7, the signal Sd showing the predetermined value of the ball diameter and the signal Sa showing the wire diameter are inputted and the power supply switch-on signal 7 (Step S31) is inputted. The timing signal generator 12b generates the discharge start timing signal. In this case, the voltage value Vo between the output terminals immediately before the discharge start exists between Vdn and Vup (Steps S32, S33, S34, S35, S36). When either short-error and open-error is not occurred, the voltage signal between the output terminals is stored into the ball diameter determination circuit 23 according to the voltage value Vo between the output terminals immediately before the discharge start and the voltage value V1 between the output terminals immediately after the discharge start. The voltage values V1, V2 between the output terminals are changed according to a gap length 11. According to the characteristics, the discharge current setting circuit 22 and the ball diameter determination circuit 23 calculate the value of the varied gap length when the discharge is started. That is, the value of the varied gap length is calculated from the value of the voltage signal between the output terminals according to the voltage value Vo between the output terminals. According to the calculated gap length, the initial value setting data is used in order to set the appropriate discharge current setting signal 9. The resultant discharge current setting signal 9 is supplied for the high voltage power source circuit 13a. Next, a threshold value Va corresponding to the signal Sd showing the predetermined value of the ball diameter is calculated from the voltage signal between the output terminals corresponding to the voltage values Vo, V1 between the output terminals and the initial value setting data (Step S37).

As shown in FIG. 8A, the gap length 11 in the discharge start is changed to a gap length 12 after a discharge is completed shown in FIG. 8B. In FIG. 8C, the ordinate shows a voltage value between the output terminals. The abscissa shows a time. When, as shown in FIGS. 8A and 8B, a difference occurs between the gap length prior to the discharge start and the gap length after discharge end, the potential difference $\Delta V$ is occurred as shown in FIG. 8C. That is, the difference $\Delta V$ is occurred between the voltage value V1 between the output terminals corresponding to the gap length 11 and the voltage value V2 between the output terminals corresponding to the gap length 12. That is, the ball diameter determination circuit 23 calculates the difference $\Delta V$ from the voltage signal between the output terminals corresponding to the stored voltage value V1 between the output terminals. After then, when the change $\Delta V$ of the voltage reaches the threshold value Va, the ball diameter determination circuit 23 outputs the stop signal 18 in order to stop discharge (Step S38). A relationship between the voltage values Vo, V1 between the output terminals, the change $\Delta V$ of the voltage, the gap lengths 11, 12 and the ball diameter is same as the relationship of the first emembodiment. The relationship is previously examined in order to be stored in the initial value setting circuit.

The operation is summarized below. A gap length between the torch electrode 4 and the metallic thin wire 2 is estimated from the voltage values V0, V1 between the output terminals. The appropriate discharge current is automatically set corresponding to the distance of the gap length. Further, the ball diameter is controlled in order to be constant by the difference $\Delta V$. Where, the difference $\Delta V$ is a difference between the voltage value V1 between the output terminals immediately after the discharge start and the voltage value V2 between the output terminals when the discharge is completed. For example, when the gap length 11 is larger, the ball diameter becomes larger. Accordingly, the discharge current is previously set smaller in order to stop discharge when the voltage difference $\Delta V$ reaches a threshold value Va.

According to a test, the result is as follows. For example, the preset wire diameter $\phi 30$ μm and ball diameter $\phi 75$ μm are changed to $\phi 25$ μm and $\phi 70$ μm, respectively. In this case, the above change operation is completed about in three minutes.

Further, for example, independently stored ROM is exchanged in the initial value setting circuit 24 in order to correspond to a shape of the torch electrode of the bonding apparatus, a signal showing the wire diameter of the metallic thin wire, an initial value setting data in case of different materials etc.. As a material of the metallic thin wire 2, for example, a gold, a silver, etc. may be applied.

According to the second embodiment, the distance between the torch electrode 4 and the metallic thin wire 2 can be obtained in high precision by the voltage values Vo, V1 between the output terminals and the voltage difference $\Delta V$. Accordingly, it is possible to control a constant ball diameter at the end of the metallic thin wire 2. That is, since the ball diameter has less variation, it is possible to stably form the ball bonded diameter and its thickness when bonding. Also, it is possible to enhance a reliability of bonding operation. Further, it is possible to enhance yield and quality. Furthermore, it is possible to join the ball to the pad more finely. Also, the signal Sa showing the wire diameter and the signal Sd showing the ball diameter are only inputted so that control time can be reduced. Further, it is possible to operate the apparatus easily. Also, by the initial value setting circuit 24, under any condition, a variation of the ball diameter can be minimized.

The voltage signal between the output terminals outputted from the high voltage detecting circuit 14a may be converted from an analog signal to a digital signal. In this case, according to the first embodiment, at least the ball diameter calculator 16 and the ball diameter display device 17 are constructed as a circuit for operating the digital signal. Also, according to the second embodiment, at least the discharge current setting circuit 22 and the ball diameter determination circuit 23 are constructed as a circuit for operating the digital signal.

As explained above, according to the present invention, it is possible to provide a more reliable wire bonding apparatus which can set and control a requirement for a short time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A wire bonding apparatus comprising:

a torch electrode;

a capillary disposed near said torch electrode for introducing a metallic thin wire for bonding nearby said torch electrode;

a timing signal generator for generating a discharge start timing signal according to a start signal;

a high voltage power source circuit having an input terminal inputted a stop signal and a discharge current setting signal, wherein said discharge start timing signal is supplied so that a current is supplied for said metallic thin wire and said torch electrode according to said discharge current setting signal in order to generate a discharge between said metallic thin wire and said torch electrode, whereby the end of said metallic thin wire is melted for a ball formation, said stop signal is inputted in order to stop said current supply;

a high voltage detecting circuit for detecting a voltage between said metallic thin wire and said torch electrode in order to output the detected voltage as a voltage signal;

a ball diameter calculator having an input terminal inputted with a signal showing a predetermined value of a ball diameter and a signal showing a wire diameter of said metallic thin wire, wherein said voltage signal is inputted so that said formed ball diameter is calculated by a value of said voltage signal, said signal showing the predetermined value of the ball diameter and said signal showing the wire diameter; and a ball diameter display device for displaying said formed ball diameter outputted from said ball diameter calculator.

2. A wire bonding apparatus according to claim 1, wherein said timing signal generator provides said discharge start timing signal for said ball diameter calculator, and said ball diameter calculator supplied with said discharge start timing signal not only detects a minimum value and a maximum value of said voltage signal, but also calculates said formed ball diameter by said minimum and maximum values of said voltage signal, the other values of said voltage signal, said signal showing the predetermined value of said ball diameter and said signal showing said wire diameter.

3. A wire bonding apparatus comprising:

a torch electrode;

a capillary disposed near said torch electrode for introducing a metallic thin wire for bonding nearby said torch electrode;

a timing signal generator for generating a discharge start timing signal according to a start signal;

a high voltage power source circuit having an input terminal inputted a stop signal and a discharge current setting signal, wherein said discharge start timing signal is provided so that a current is supplied for said metallic thin wire and said torch electrode according to said discharge current setting signal in order to generate a discharge between said metallic thin wire and said torch electrode, whereby the end of said metallic thin wire is melted for a ball formation, said stop signal is inputted in order to stop said current supply;

a high voltage detecting circuit for detecting a voltage between said metallic thin wire and said torch electrode in order to output the detected voltage as a voltage signal;

a discharge current setting circuit having an input terminal inputted a signal showing the predetermined value of the ball diameter and a signal showing the wire diameter of said metallic thin wire, wherein said discharge start timing signal is inputted so that a value of said discharge current is calculated by the inputted signal showing the predetermined value of said ball diameter and the inputted signal showing said wire diameter in order to output said discharge current setting signal; and a ball diameter determination circuit wherein said signal showing the predetermined value of said ball diameter, said signal showing said wire diameter and said voltage signal are inputted so that said ball diameter formed at the end of said metallic thin wire is not only calculated by said signal showing the predetermined value of said ball diameter, said signal showing said wire diameter and said voltage signal, but also is compared to the predetermined value of said ball diameter, whereby, said formed ball diameter is determined to correspond to the predetermined value of said ball diameter so that said stop signal is supplied for said high voltage power source circuit.

4. A wire bonding apparatus according to claim 3 comprising:

an initial value setting circuit wherein said signal showing the predetermined value of said ball diameter and said signal showing said wire diameter are inputted so that an initial value of a setting requirement is provided for said discharge current setting circuit and said ball diameter determination circuit; and wherein said discharge current setting circuit calculates a value of said discharge current by said signal showing the predetermined value of said ball diameter, said signal showing said wire diameter and said initial value, said timing signal generator provides said discharge start timing signal for said ball diameter determination circuit, said ball diameter determination circuit supplied with said discharge start timing signal not only detects a minimum value and a maximum value of said voltage signal, but also calculates said ball diameter by the minimum and maximum values of said voltage signal, the other values of said voltage signal, said initial value, said signal showing the predetermined value of said ball diameter and said signal showing said wire diameter.

* * * * *